(12) United States Patent
van Roosmalen et al.

(10) Patent No.: US 11,769,847 B2
(45) Date of Patent: Sep. 26, 2023

(54) SOLAR PANEL WITH FOUR TERMINAL TANDEM SOLAR CELL ARRANGEMENT

(71) Applicant: Nederlandse Organisatie voor toegepast-natuurwetenschappelijk Onderzoek TNO, s-Gravenhage (NL)

(72) Inventors: Johannes Adrianus Maria van Roosmalen, Petten (NL); Siegfried Christiaan Veenstra, Petten (NL); Dong Zhang, Petten (NL); Markus Johan Jansen, Petten (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 319 days.

(21) Appl. No.: 16/629,322

(22) PCT Filed: Jul. 11, 2018

(86) PCT No.: PCT/NL2018/050469
§ 371 (c)(1),
(2) Date: Jan. 8, 2020

(87) PCT Pub. No.: WO2019/013630
PCT Pub. Date: Jan. 17, 2019

(65) Prior Publication Data
US 2021/0143292 A1    May 13, 2021

(30) Foreign Application Priority Data
Jul. 11, 2017    (NL) ...................................... 2019226

(51) Int. Cl.
*H01L 31/0725*    (2012.01)
*H01L 31/05*    (2014.01)
*H01L 31/074*    (2012.01)

(52) U.S. Cl.
CPC ...... *H01L 31/0725* (2013.01); *H01L 31/0508* (2013.01); *H01L 31/0516* (2013.01); *H01L 31/074* (2013.01); *Y02E 10/56* (2013.01)

(58) Field of Classification Search
CPC ............. H01L 31/0725; H01L 31/0508; H01L 31/0516; Y02E 10/56
See application file for complete search history.

(56) References Cited

U.S. PATENT DOCUMENTS 8,569,613 B1 * 10/2013 Brown .................. H01L 31/043
438/93
2010/0200043 A1 * 8/2010 Lombardo ........ H01L 31/03921
136/244
(Continued)

FOREIGN PATENT DOCUMENTS

CN    102496635 A    6/2012
CN    102918656 A    2/2013
(Continued)

OTHER PUBLICATIONS

Jaysankar "Four-Terminal Perovskite/Silicon Multijunction Solar Modules" Adv. Energy Mater. Jul. 2017, 1602807, pp. 1-8 (Year: 2017).*

(Continued)

*Primary Examiner* — Devina Pillay
(74) *Attorney, Agent, or Firm* — N.V. Nederlandsch Octrooibureau

(57) ABSTRACT

A solar panel includes a silicon cells submodule of silicon based cells, a front transparent plate and a backsheet. The backsheet is arranged with at least a first conductive pattern that is connected to rear surface electrical contacts on each of the silicon cells. A thin film photovoltaic submodule is arranged between the front transparent plate and the silicon cells, and includes thin film cells in an arrangement with two photovoltaic submodule contacts that connect to a second (Continued)

conductive pattern on the backsheet. The backsheet is arranged for four-terminal wiring with the first pattern for the silicon cells and the second pattern for the thin film cells. The thin film cells are disposed in a first group of cells and in at least a second group of cells, each connected in series. The first group is connected in parallel with the second group, between the photovoltaic submodule contacts.

15 Claims, 5 Drawing Sheets

(56) References Cited

U.S. PATENT DOCUMENTS

| | | | | |
|---|---|---|---|---|
| 2013/0312808 | A1* | 11/2013 | Bauer | H01L 31/0504 |
| | | | | 136/244 |
| 2016/0126380 | A1* | 5/2016 | Chang | H01L 31/048 |
| | | | | 136/251 |
| 2018/0083151 | A1* | 3/2018 | Shibasaki | H01L 31/0465 |

FOREIGN PATENT DOCUMENTS

| | | | | |
|---|---|---|---|---|
| CN | 206250211 | | 6/2017 | |
| DE | 102009042093 | A1 * | 3/2011 | ......... H01L 31/0504 |
| DE | 102011089916 | | 6/2013 | |

OTHER PUBLICATIONS

DE-102009042093-A1, Machine Translation (Year: 2011).*
Zhang Dong et al: "Combination of Advanced Optical Modelling with Electrical Simulation for Performance Evaluation of Practical 4-terminal Perovskite/c-Si Tandem Modules", Energy Procedia, Elsevier, NL, vol. 92, Sep. 23, 2016, pp. 669-677.
Bailie et al: "Semi-transparent perovskite solar cells for tandems with silicon and CIGS", Energy & Environmental Science, vol. 8, No. 3, Dec. 23, 2014, pp. 956-963.
Kruhler et al: "Solar Module Using A-Si:H and C—Si", Proceedings of the International Photovoltaic Energy Conference. Florence, May 9-13, 1988; [Proceedings of The International Photovoltaic Energy Conference], Dordrecht, Kluwer, NL, vol. 1, May 9, 1988, pp. 821-825.

* cited by examiner

SOLAR PANEL WITH FOUR TERMINAL TANDEM SOLAR CELL ARRANGEMENT

FIELD OF THE INVENTION

The present invention relates to a solar panel. Additionally, the invention relates to a method for manufacturing a solar panel.

BACKGROUND

Tandem or more generally multi-junction solar cells are nowadays seen as a serious contender to reach higher efficiencies for wafer based Si technologies. Tandems can have a two-terminal (2T), three-terminal (3T) and four-terminal (4T) geometry. 3T geometry is not often considered, since an intermediate layer of the tandem solar cell would need to be current transporting.

2T tandem solar cells contain one electrode on top and one on bottom, while in 4T tandem solar cells, two independent solar cell devices are stacked on top of each other, having a transparent isolation layer between the top and bottom devices. 4T tandems can have various advantages over 2T tandems. A requirement for a 2T tandem solar cell is that the currents of the top and bottom solar cells need to be matched. Current matching is usually established at standard testing conditions. For 4T tandem solar cells the voltages and currents of the top solar cell and bottom solar cell are separate and independent from each other, but during DC conversion of the respective separate outputs these voltages can be converted to a single output level by using separate DC converters for the top solar cells and bottom solar cells.

Spectral change due to incident angles, weathers, seasons and so on can induce current mismatch, resulting in considerable power losses in 2T tandems.

Moreover, for 2T tandem solar cells that consist of a top thin film solar cell and a bottom crystalline silicon based solar cell, manufacturing is complex as the thin film device must be created on the crystalline solar cell.

A crystalline silicon module with 60 silicon wafers and a size of $1 \times 1.6$ m$^2$ can generate a Voc of about 40 V. A thin film module with, for example, perovskite based thin film solar cells with the same dimension and all cells connected in series can lead to a Voc of about 220 V in case that the cell width is about 4 mm and the length of the cells is perpendicular to the 1 m short edge. This large voltage difference between the thin film module and the crystalline silicon module can be problematic when they are combined to make a 4-terminal tandem solar panel, e.g. due to voltage compatibility of (components in) the DC-DC converter or safety regulations. A reduction of the output voltage between the photovoltaic module contact terminals of the thin film module is therefore beneficial.

Using a 4T tandem solar cell requires that a wiring is provided for both the bottom and the top solar cells. When the wiring has to be constructed separately for top and bottom submodule, and top and bottom submodule have to be connected in separate process steps to their interconnecting wiring, this adds to manufacturing complexity and cost.

It is an object of the present invention to provide an improved 4T tandem solar cell device and a method for manufacturing such a 4T tandem solar cell device, that overcome or mitigate the above detrimental effects.

SUMMARY OF THE INVENTION

The above object is achieved by a solar panel according to claim 1. Also, the present invention relates to a method according to claim 14.

The invention provides that at least two submodules are created, one or more first bottom submodules, for example based on silicon solar cells, in which the plurality of bottom solar cells (e.g. crystalline silicon based) are arranged, and one or more second top submodules (e.g. thin film based), in which the plurality of top solar cells (e.g. thin film based) are arranged.

Each submodule is arranged with two contact terminals. At the back side of the bottom submodule a first two-terminal wiring layout is arranged for electrical connection with the contact terminals of the bottom submodule or with the contact terminals of the cells of the bottom submodule, and a second two terminal wiring layout is arranged for electrical connection with the top submodule or with the contact terminals of the cells of the top submodule. These wiring layouts can e.g. be arranged as patterns in a conductive backsheet.

Each two terminal wiring layout is provided with two contact terminals, indicated as backsheet contact terminals if the wiring layouts are created in a conductive backsheet, i.e., two contact terminals for the bottom submodule and two contact terminals for the top submodule. The following description will be specific for conductive backsheet, but will similarly be applicable to other materials for the wiring layouts such as e.g. patterns of metal ribbons. The top submodule may be created on a front transparent plate on a surface thereof that is facing towards the silicon wafers of the bottom submodule. By fabricating the arrangement of the plurality of top solar cells on a surface of a front transparent plate a standard method for manufacturing thin film solar cells can be used without any interference with the solar cells on the bottom submodule. The top solar cells are arranged in a series connection within at least two branches of a first set of top solar cells electrically connected in series and a second set of top solar cells electrically connected in series, with the two branches being connected in parallel between one of the backsheet contact terminals for the top submodule and the other of the backsheet contact terminals for the top submodule. By providing the parallel connection of the first and second set, the open circuit voltage of the plurality of top solar cells is reduced in comparison with a single series connection of all top solar cells in said plurality. Since in a tandem the open circuit voltage of a top solar cell is typically higher than the open circuit voltage of a bottom solar cell, in this manner the open circuit voltage of the top submodule can be brought closer to the open circuit voltage of the silicon wafer based bottom submodule. As a result during use of the solar panel, a single DC-DC converter may be used for conversion of both the output voltage of the bottom submodule and the output voltage of the top submodule, or a DC-DC converter with two inputs may be used which can operate more optimally.

According to an aspect, the invention provides a solar panel as described above, wherein the first conductive pattern of the backsheet has a layout that provides a series connection of the plurality of silicon based solar cells, such that back-contacts of one polarity of one silicon based solar cell are connected to back-contacts of opposite polarity of an adjacent silicon based solar cell.

According to an aspect, the invention provides the solar panel as described above, wherein the electrical connections of the photovoltaic submodule contact terminals to the second conductive pattern layout are at an outer edge of the backsheet surrounding the arrangement of the crystalline silicon based solar cells on the backsheet and/or at a location in between a pair of adjoining crystalline silicon based solar cells.

According to an aspect, the invention provides the solar panel as described above, wherein the first conductive pattern is a two-dimensional path with a separating interspace, and the second conductive pattern is arranged within the separating interspace.

According to an aspect, the invention provides the solar panel as described above, wherein the one photovoltaic submodule contact terminal is connected to a first part of the second conductive pattern arranged as terminal of a first polarity, and the other photovoltaic submodule contact terminal is connected to a second part of the second conductive pattern arranged as terminal of a second polarity, opposite the first polarity.

According to an aspect, the invention provides the solar panel as described above, wherein each thin film photovoltaic submodule contact terminals comprises a thin film contact pad that is arranged on the surface of the front transparent plate facing towards the silicon solar cells based submodule; the backsheet comprises a corresponding backsheet contact pad for each thin film contact pad, and the solar panel comprises an interconnecting conductive body between the thin film contact pad and the backsheet contact pad.

According to an aspect, the invention provides the solar panel as described above, wherein the thin film contact pad is a patterned area of a thin film layer or a thin film layer structure on the front transparent plate.

According to an aspect, the invention provides the solar panel as described above, wherein the interconnecting conductive body consists of an electrically conductive adhesive material.

According to an aspect, the invention provides the solar panel as described above, wherein the interconnecting conductive body is dot-shaped or line-shaped or layer-shaped.

According to an aspect, the invention provides the solar panel as described above, wherein the thin film solar cells are based on a perovskite material as photovoltaic material.

According to an aspect, the invention provides the solar panel as described above, wherein the front transparent plate is attached to the silicon solar cells based submodule by a transparent encapsulant layer between the plurality of thin film solar cells and the plurality of crystalline silicon based solar cells.

According to an aspect, the invention provides the solar panel as described above, further comprising a DC-DC converter which is operable for conversion of a first output voltage from the first conductive pattern and for conversion of a second output voltage from the second conductive pattern.

According to an aspect, the invention provides a method for manufacturing a solar panel comprising:
providing a silicon solar cells based submodule holding an arrangement of a plurality of silicon based solar cells;
providing a front transparent plate and a backsheet;
providing the backsheet with at least a first conductive pattern; arranging the silicon solar cells based submodule between the front transparent plate and the backsheet with the front transparent plate being above the front surfaces of the plurality of silicon based solar cells, in which the plurality of silicon based solar cells each are provided with electrical contacts on a rear surface with each rear surface arranged on the backsheet, such that each silicon based solar cell of the silicon solar cells based submodule is electrically connected to the first conductive pattern; arranging a thin film photovoltaic submodule on the surface of the front transparent plate facing towards the silicon solar cells based submodule, the thin film photovoltaic submodule comprising a plurality of thin film solar cells and being arranged with two photovoltaic submodule contact terminals in a layout such that the photovoltaic submodule contact terminals electrically connect to a second conductive pattern on the backsheet outside of locations of the first conductive pattern on the backsheet, and arranging the backsheet for four-terminal wiring layout with the first conductive pattern for providing electrical connections to the plurality of silicon based solar cells and the second conductive pattern for providing electrical connections to the plurality of thin film solar cells, and the method further comprises:
arranging the plurality of thin film solar cells in a series connection in an array, with a first group of thin film solar cells electrically connected in series and a second group of thin film solar cells electrically connected in series; the first group being in an electrical parallel connection with the second group, between the photovoltaic submodule contact terminals, with one end of the electrical parallel connection being connected to one of the photovoltaic submodule contact terminals and the other end of the electrical parallel connection connected to the other photovoltaic submodule contact terminal.

Advantageous embodiments are further defined by the dependent claims.

BRIEF DESCRIPTION OF DRAWINGS

The invention will be explained in more detail below with reference to drawings in which illustrative embodiments thereof are shown. They are intended exclusively for illustrative purposes and not to restrict the inventive concept, which is defined by the appended claims.

In the individual figures elements with a same reference number refer to corresponding or similar elements.

DETAILED DESCRIPTION OF EMBODIMENTS

Figure 1:
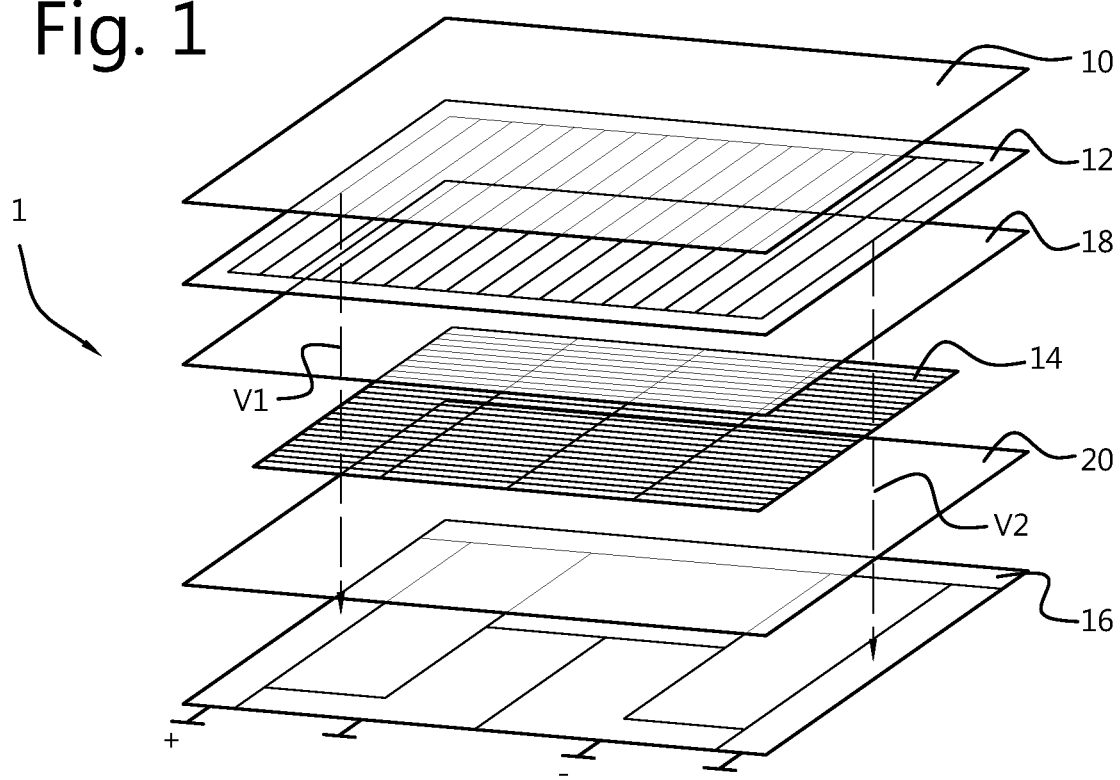
FIG. 1 shows schematic exploded view of a solar panel in accordance with an embodiment of the invention.

FIG. 1 shows schematic an exploded view of a solar panel comprising an embodiment of the invention.

A solar panel 1 comprising an embodiment of the present invention comprises a front transparent plate 10, a first solar cell submodule 12, a second solar cell submodule 14 and a backsheet 16, forming a stack in that order.

In between the first and second solar cell submodules 12, 14 a first encapsulant layer 18 is disposed. In between the second solar cell submodule 14 and the backsheet 16 a second encapsulant layer 20 is disposed.

The first solar cell submodule 12 consists of an array of thin film solar cells that are arranged on a surface of the front transparent plate 10 that faces the second solar cell submodule 14. In this specification, the first solar cell submodule 12 will also be referred to as the thin film submodule 12.

The thin film solar cells are configured to capture radiation during use from a source such as the Sun and convert the captured radiation into electrical energy by means of the photovoltaic effect.

The second solar cell submodule 14 consists of an array of silicon based solar cells (for example crystalline silicon based solar cells), i.e., the silicon based solar cells are based on silicon substrates each provided with a layer structure of differently doped silicon layers (p-type and n-type). In this specification, the second solar cell submodule 14 is also referred to as the silicon based submodule 14.

In the second solar cell submodule 14, the solar cells are arranged with a light capturing surface facing towards the front transparent plate 10. During use, the silicon based solar cells are configured to capture radiation from a source such as the Sun and convert the captured radiation into electrical energy by means of the photovoltaic effect. The skilled in the art will appreciate that such silicon based solar cells comprise in a non-limiting manner, H-cells, metal-wrap-through (MWT) solar cells, emitter-wrap-through (EWT) solar cells and (interdigitated) back-contact solar cells.

Since the first solar cell submodule 12 with thin film solar cells is arranged between the front transparent plate 10 and the second solar cell submodule 14 with silicon based solar cells, the thin film solar cells are configured as wide band-gap thin film solar cells having a higher band-gap energy level than the band-gap energy level of silicon. In this manner, the thin film solar cells are configured to capture radiation in substantially the visible region of the electromagnetic spectrum, and to let infrared radiation pass. The silicon based solar cells are configured to capture radiation in substantially the infrared region of the electromagnetic spectrum.

A wide band-gap thin film solar cell typically consists of an absorber layer (for example: metal-organic halide perovskite, kesterite such as copper zinc tin sulfide, chalcogenide such as copper indium gallium selenide, thin film silicon, organic absorber layers (Organic PhotoVoltaic, OPV, Dye Sensitized Solar Cell, DSSC), III-V compound semiconductor, CdTe, a layer comprising quantum dots, etc.), suitable semi-transparent electrodes and possibly auxiliary layers like a window layer to form a p-n heterojunction in the case of for example chalcogenides or the CdS/CdTe junction, and/or charge selective layers as often applied in OPV and metal-organic halide perovskite solar cells.

The crystalline silicon based solar cells in the second solar cell submodule are each connected to a first conductive patterned circuit on the backsheet.

The thin film solar cells in the first solar cell submodule (also referred to as photovoltaic submodule) that are arranged on the inward facing surface of the front transparent plate in at least one row in the direction of an edge of the front transparent plate are interconnected in a series connection between two terminals, (in use, one terminal with "+" polarity and the other with "−" polarity) indicated here as photovoltaic submodule contact terminals V1, V2.

Each of the photovoltaic submodule contact terminals V1, V2 is connected with a second conductive patterned circuit on the backsheet. Typically, the photovoltaic submodule contact terminals and the connections to the second conductive patterned circuit are located outside of locations of the electrical contacts of the silicon based solar cells on the backsheet. This will be described in more detail with reference to FIGS. 4-6D.

In this manner, a 4T tandem solar panel is created with two terminals coupled to the arrangement of silicon based solar cells through the first conductive patterned circuit and two other terminals coupled to the arrangement of thin film solar cells through the second conductive patterned circuit. It is noted that this 4T solar panel does not require a 4T tandem integration on solar cell level, i.e., by creating 4T tandem solar cells. Instead the 4T configuration is created by integration of thin film submodule and silicon based submodule, each comprising a plurality of thin film solar cells and silicon based solar cells, respectively.

Since a thin film submodule based on perovskite photovoltaic material can produce much higher voltage than a silicon based submodule, the invention also provides an arrangement of the thin film solar cells in the thin film submodule that allows to reduce the output voltage between the photovoltaic submodule contact terminals.

Thus, the invention further provides that a reduction of the output voltage between the photovoltaic submodule contact terminals of the thin film submodule is obtained.

The thin film solar cells that consist of a plurality of strips arranged in parallel in a length direction of the front transparent plate are divided in a first and a second set of thin film solar cells in which the strips in each of the first and second set are electrically interconnected in series. The first and second serial sets are then electrically connected in parallel with their end nodes connected to the associated photovoltaic submodule contact terminals. In this manner, by subdividing the plurality of thin film solar cells into at least two parallel sets of series connected thin film solar cells, the output voltage of the thin film solar cells is reduced by at least 50% in comparison with a simple series connection of the plurality of the strips along the length direction of the front transparent plate.

Figure 2:
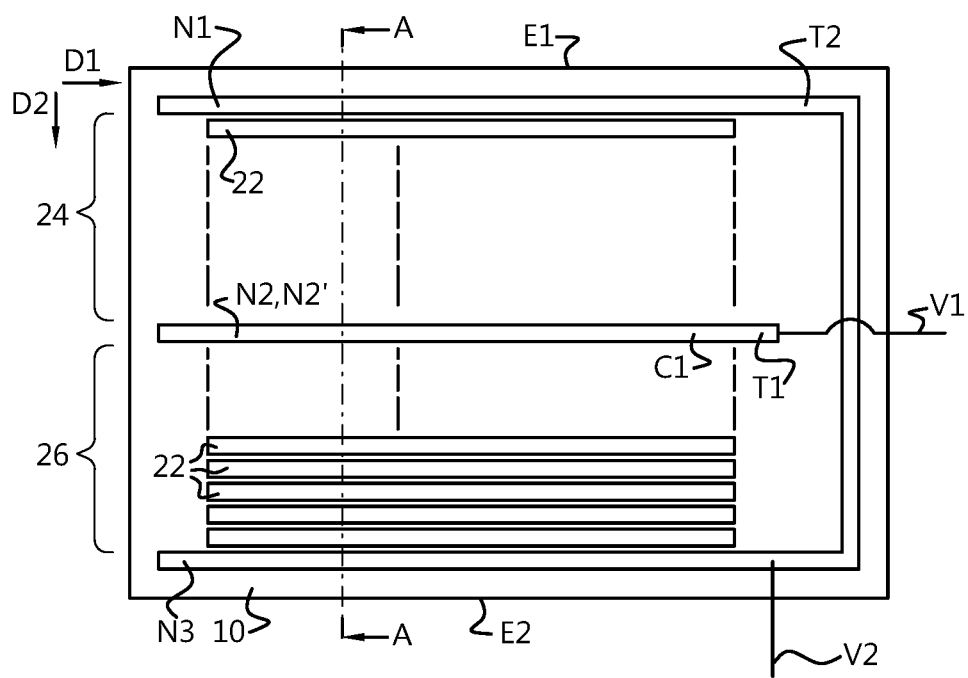
FIG. 2 shows a schematic layout of the thin film solar cells arrangement according to an embodiment of the invention.

FIG. 2 shows schematically a top view of a layout of the thin film solar cells arrangement according to an embodiment of the invention.

On the front transparent plate 10, thin film solar cells 22 are arranged in an array, in which the thin film solar cells 22 are shaped as parallel strips that are extending in a first direction D1 and that are in transverse direction D2 connected in series. The array is divided in a first set 24 and a second set 26 of thin film solar cells. The first set 24 extends between one edge E1 of the front transparent plate 10 and a centre C1 of the plate between a first edge node N1 and a first central node N2 of the first set's series connection.

The second set 26 extends between the opposite edge E2 of the front transparent plate 10 and the centre, between a second edge node N3 and a second central node N2' of the second set's series connection which coincides with first central node N2: In both sets the polarity of the central node N2, N2' is the same and the first and second central nodes are therefore interconnected by a central terminal connection T1. The first and second edge nodes N1, N3 are interconnected by an outer terminal connection T2. In this manner, the rows of thin film solar cells are divided in two parallel serial branches.

The central terminal connection T1 has a first end node connected to one of the photovoltaic submodule contact terminals V1. The outer terminal connection T2 has a second end node connected to the other of the photovoltaic submodule contact terminals V2.

Figure 3A:
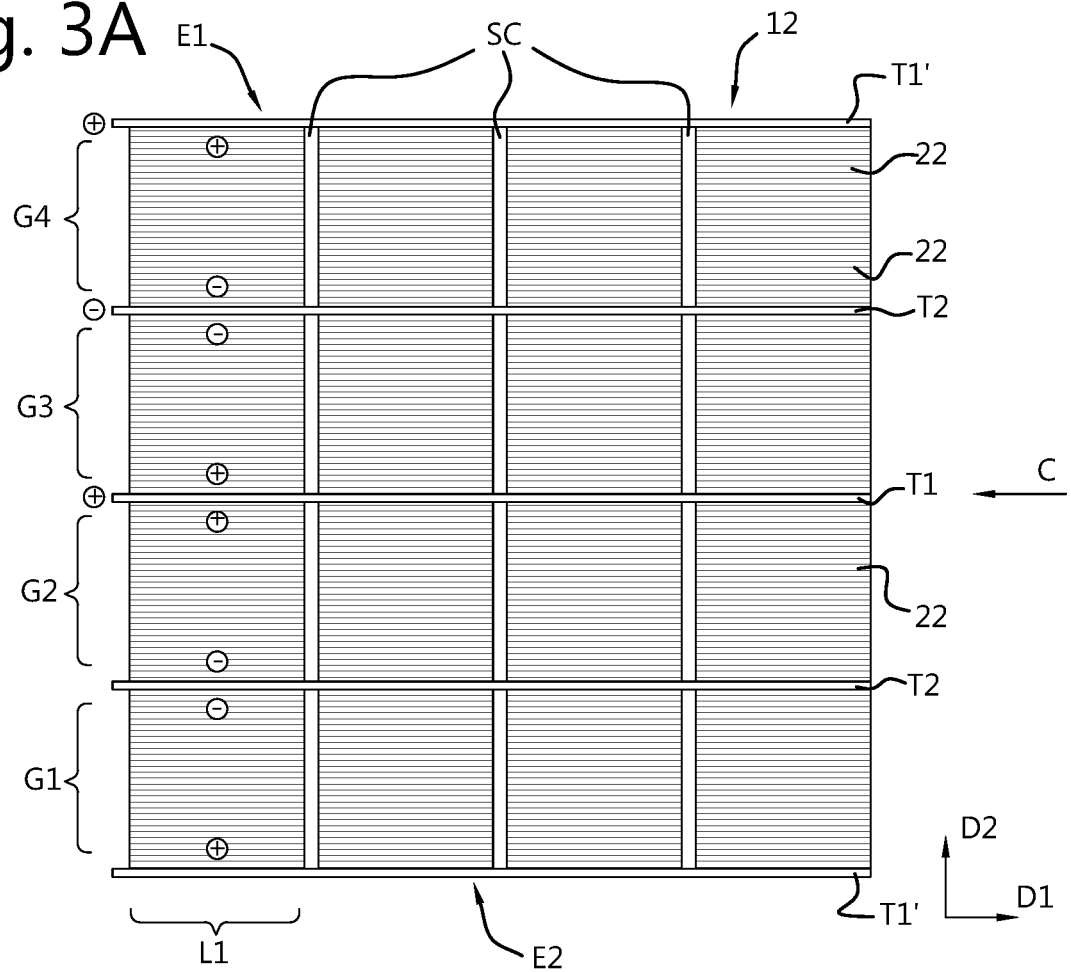
FIG. 3A, 3B, 3C show a top view, a first cross-section and a second cross-section, respectively, of a layout of a thin film submodule according to an embodiment of the invention.
Figure 3B:
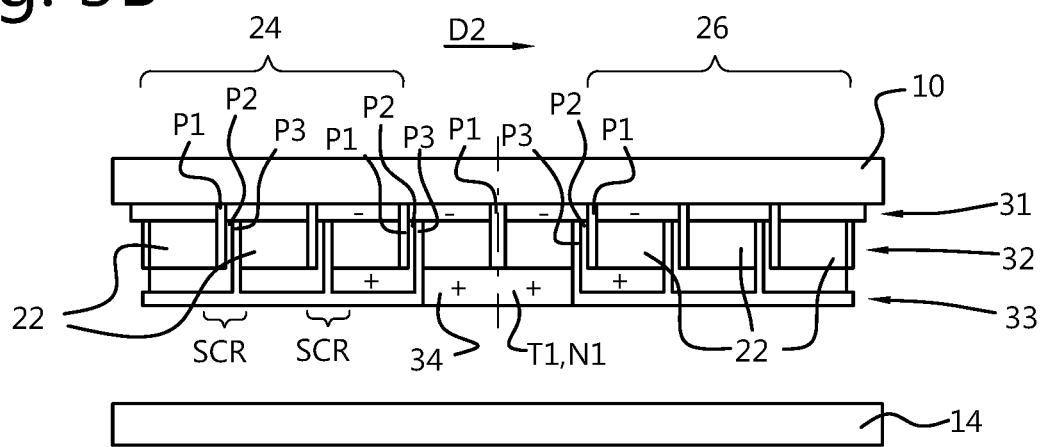
Figure 3C:
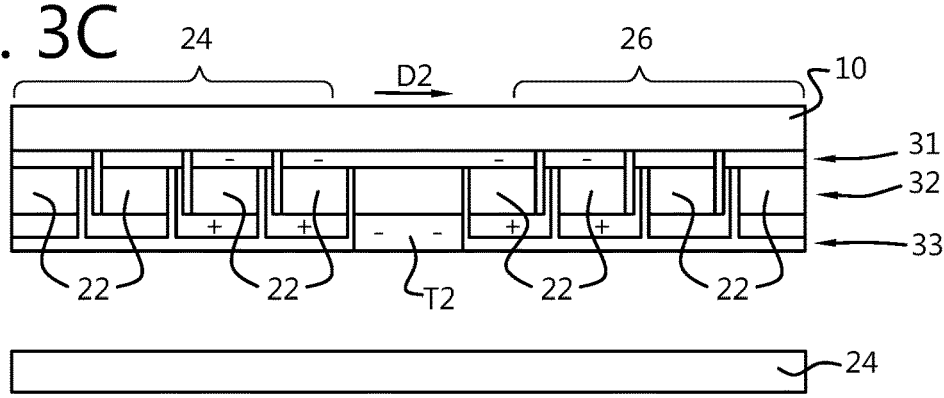

FIG. 3A, 3B, 3C show a top view, a first cross-section and a second cross-section, respectively, of a layout of a thin film submodule according to an embodiment of the invention.

In FIG. 3A, a top view of the layout of a thin film submodule 12 is shown. A plurality of thin film solar cells 22 are arranged as strips extending parallel to each other in a first direction D1 over a length L1. In the first direction D1, the strips may be interrupted, e.g. by scribes SC, extending in the second direction D2 that is perpendicular to D1.

The thin film solar cells on the thin film submodule 12 are subdivided in a number of groups G1 . . . G4 of thin film solar cell strips 22 connected in series between "+" and "−" group terminals, in which adjacent groups are oriented with regard to the polarity of the group terminals T1, T2 of each group in such a way that equal polarities are present at a group terminal that is located intermediate the two adjacent groups. As a result the intermediate group terminal is common to both of the adjacent groups which allows to electrically connect the adjacent groups in parallel.

In the exemplary embodiment the thin film solar cell strips 22 are interconnected and subdivided in four groups G1 . . . G4 with shared intermediate group terminals T1, T2. In the centre C of the thin film solar cell module 12, a central first group terminal T1 with a first polarity for example positive polarity "+" is located. Then at the outer edges E1, E2 of the module, running parallel to the first direction D1, additional first group terminals T1' of the same first polarity are located. In between each additional first group terminal T1' and the central first group terminal T1, a second group terminal T2 is arranged with a second i.e., opposite, polarity, in this example negative polarity "−".

In FIGS. 3B and 3C a detailed cross-section of the thin film submodule 12 along the second direction D2 is shown at a first group terminal T1 of first polarity and at a second group terminal T2 of second polarity.

The plurality of thin film solar cells is divided in a number of sets 24, 26 of interconnected thin film solar cell strips 22. Within each set the thin film solar cell strips 22 are electrically connected in series, by interconnection in the second direction D2 transverse to the first direction D1. Each set is provided with a first and second group terminal in such a way that between the first and second group terminals the thin film solar cell strips 22 are in a series connection.

FIG. 3B shows a cross-section of thin film solar cells near a first terminal T1 of first polarity.

The cross-section extends along line A-A in the second direction D2 as shown in FIG. 3A.

The thin film solar cells 22 are divided in the first set 24 and the second set 26, with a central node T1, N1 in the centre of the series connection.

The direction of the polarity in the series connection of the first set 24 is opposite to the direction of polarity in the series connection of the second set 26. Thus the central node T1 has a same first polarity and the end node of each of the first and second sets 24, 26 located towards the respective edge E1, E2 of the front transparent plate 10 has a same second opposite polarity.

The thin film solar cells 22 each comprise a layered structure of a first transparent or semi-transparent electrode layer 31, a photovoltaic or absorber layer 32 and a second transparent or semi-transparent electrode layer 33. The first transparent electrode layer 31 is overlying the surface of the front transparent plate 10 facing towards the silicon based submodule indicated schematically by block 14. The photovoltaic layer 32 is disposed between the first and second (semi-) transparent electrode layers 31, 33.

The thin film solar cells 22 are demarcated by a combination of filled scribes SCR in the first transparent electrode layer 31, the photovoltaic layer 32 and the second transparent electrode layer 33, respectively, to define a series connection between adjoining thin film solar cells. In the direction from the edges to the central node, the combination of scribes comprises a (transparent) insulator filled P1 scribe that provides an isolation in the first transparent electrode layer 31 between adjacent solar cells 22. Towards the central node t1, next a (transparent) conductor filled P2 scribe is present that provides a conductive connection between the first and second transparent electrode layers 31, 33 cutting through the intermediate photovoltaic layer 32.

Adjacent to the P2 scribe in a direction towards the central node T1, N1, a transparent insulator filled P3 scribe is present which stops at the surface of the first transparent electrode layer 31 and isolates the photovoltaic layer 32 and the second transparent electrode layer 33 of adjoining thin film solar cells 33. The combination of P1, P2 and P3 scribes provides an electrical series connection between the adjoining thin film solar cells.

The central node T1, N1 connects the first set 24 and the second set 26 of thin film solar cells 22, by a central thin film solar cell 34. The central thin film solar cell 34 comprises a stack of the first transparent electrode layer 31, the photovoltaic layer 32 and a second transparent electrode layer 33a. The first transparent electrode layer 31 is overlying the surface of the front transparent plate 10 facing towards the silicon based submodule 14. The photovoltaic layer 32 is disposed between the first and second transparent electrode layers 31, 33a. The central thin film solar cell 34 is demarcated by a combination of P1, P2 and P3 scribes as described above on each of its sides. In between the two demarcations the first transparent electrode layer 31 is provided with a transparent insulator filled P1 scribe that divides the first transparent electrode layer 31 and the photovoltaic layer 32 into two portions. The second transparent electrode layer 33a is continuous between the two demarcations and forms an interconnection between the first set 24 of thin film solar cells 22 in series connection and the second set 26 of thin film solar cells 22 in series connection.

FIG. 3C shows a cross-section of thin film solar cells 22 near a second terminal T2.

The cross-section extends along line B-B perpendicular to the first direction D1 as shown in FIG. 3A.

As shown in FIG. 3B, two sets 24, 26 of thin film solar cell strips are interconnected in series in second direction D2, as described above in which the orientation of one of the groups is mirrored with respect to the other of the groups in such a way that at common second group terminal TT2 the groups have the same polarity.

Thin film solar cell strips 22 are demarcated and interconnected by a similar scribe arrangement of transparent insulator filled scribes P1, P3 and interconnecting transparent conductor filled scribe P2 as explained with reference to FIG. 3B.

The areal dimensions of each group of serially interconnected thin film solar cell strips on the thin film submodule 12 correspond substantially with the areal dimensions of the silicon substrate based solar cells on the silicon based submodule 14.

In this manner, a group of serially interconnected thin film solar cell strips 22 substantially covers one silicon substrate based solar cell (or optionally two or more adjacent silicon substrate based solar cell). Accordingly, the group terminals that bound each group of serially interconnected thin film solar cell strips are located outside the area of the silicon substrate based solar cell covered by the respective group. Thus, connections between the group terminals of the thin film submodule 12 and corresponding contacts on the associated second conductive patterned circuit on the backsheet can be made in gaps in between silicon substrate based solar cells arranged in the silicon based submodule 14.

Figure 4:
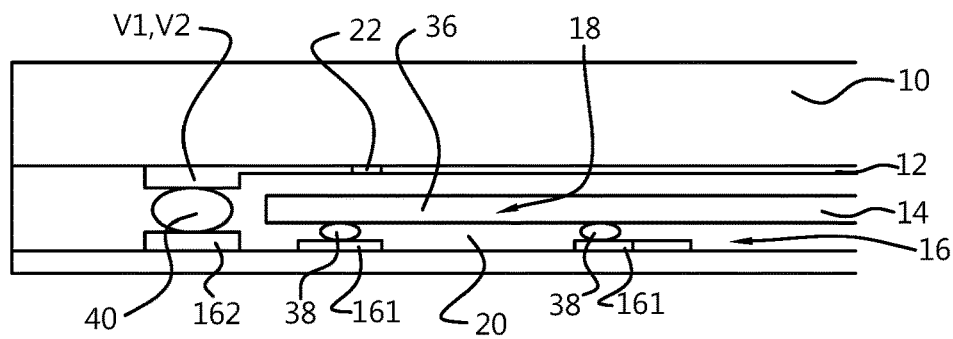
FIG. 4 shows a cross-section of a detail of a solar panel according to an embodiment.

FIG. 4 shows a cross-section of a detail of a solar panel according to an embodiment.

In FIG. 4 electrical connections between silicon based solar cells in the silicon based submodule 14 and the associated first conductive patterned circuit 161 on the backsheet 16 are shown, and electrical connections between thin film solar cells 22 in the thin film submodule 12 and the associated second conductive patterned circuit 162 on the backsheet 16.

The silicon based solar cell 36 in the silicon based submodule 14 is connected to the first conductive patterned circuit 161 by means of interconnecting conductive bodies 38 that connect a back-contact of a given polarity on the silicon based solar cell with an associated contact area of the first conductive patterned circuit 161 for the same given polarity. In between the silicon based submodule 14 and the backsheet 16 the lower encapsulant layer 20 is provided that has openings at the locations where the interconnecting conductive bodies 38 are to be located.

In a similar manner, the photovoltaic submodule contact terminals V1, V2 on the front transparent plate 10 are contacted with associated contacts of the second conductive patterned circuit 162 on the backsheet 16. The photovoltaic submodule contact terminals V1, V2 each comprise a thin film contact pad on the surface of the front transparent plate 10 that faces the silicon based submodule 14. Likewise, the second conductive patterned circuit 162 is provided with associated contact pads. In between each thin film contact pad and the associated contact pad of the second conductive patterned circuit an interconnecting conductive body 40 is arranged to provide electrical contact.

The lower encapsulant layer 20 is configured to extend outside of the edges E3 of the silicon based submodule 14 as an extended encapsulant layer between the extensions of front transparent plate 10 outside the silicon based submodule 14 and the extension of the backsheet 16 outside the silicon based submodule 14. The extended encapsulant layer has openings at the locations where the interconnecting conductive bodies 40 between the thin film contact pads and the associated contacts of the second conductive patterned circuit on the backsheet are to be located.

According to an embodiment, the interconnecting conductive bodies 38, 40 consist of an electrically conductive adhesive material.

The interconnecting conductive body 38, 40 can be shaped as a dot or a line or a pad.

According to an embodiment, the line shaped interconnecting conductive body could extend along a full width of one or more of the silicon based solar cells. Such a layout of the line shaped interconnecting conductive body would enhance the current collection in the thin film or silicon solar cells by the relative reduction of resistance losses in the conductive body, in comparison with the dot shaped conductive body.

Figure 5:
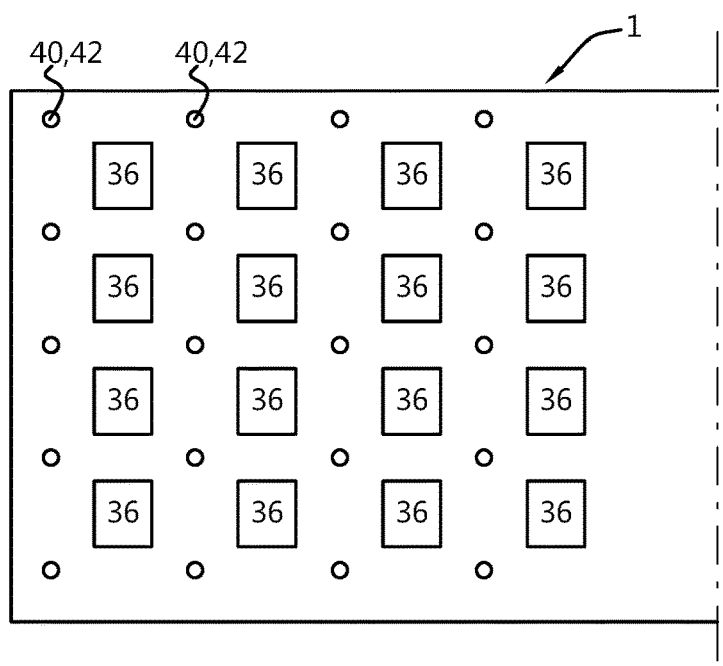
FIG. 5 shows a top view of a contacting arrangement of thin film solar cells in the solar panel.

FIG. 5 shows a top view of a contacting arrangement of thin film solar cells in the solar panel.

According to an embodiment of the invention, the thin film solar cells on the front transparent plate 10 (not shown) are divided in a plurality of solar cell sets 24, 26 in which a number of thin film solar cells 22 (not shown) are arranged in a series connection between two end nodes T1, T2 on the thin film submodule 12 (not shown) as explained above. Each of the end nodes of the series connection of a thin film solar cell set is connected to associated contacts of the second conductive patterned circuit 162 on the backsheet 16 (not shown) by means of an interconnecting conductive body 40. The interconnecting conductive bodies 40 are at locations that correspond with a central area 42 in between the corners of adjoining crystalline silicon solar cells 36. The silicon based solar cells 36 in the silicon based submodule 14 can be either square solar cells or semi-square solar cells (with truncated corners), or any other type, e.g. half cells or "shingle" cells.

Such a layout of the connections between the thin film solar cells 22 and the backsheet 162; 16 would enhance the current collection in the thin film solar cells by the relative reduction of resistance losses in the internal wiring of the thin film solar cell submodule.

Depending on the layout of the back-sheet patterns and depending on the respective "+" or "−" polarity of the associated photovoltaic submodule contact terminal, each of the interconnecting bodies 40 at locations 42 will contact a corresponding conductor on the back-sheet.

An example of a back-sheet pattern layout is described with reference to FIGS. 6A-6D.

FIGS. 6A-6D show top views of a patterned conductive backsheet 16, an arrangement of silicon based solar cells 36 on the backsheet 16, a first and second arrangement of a thin film submodule 12 on the backsheet 16 respectively, in accordance with an embodiment of the invention.

Figure 6A:
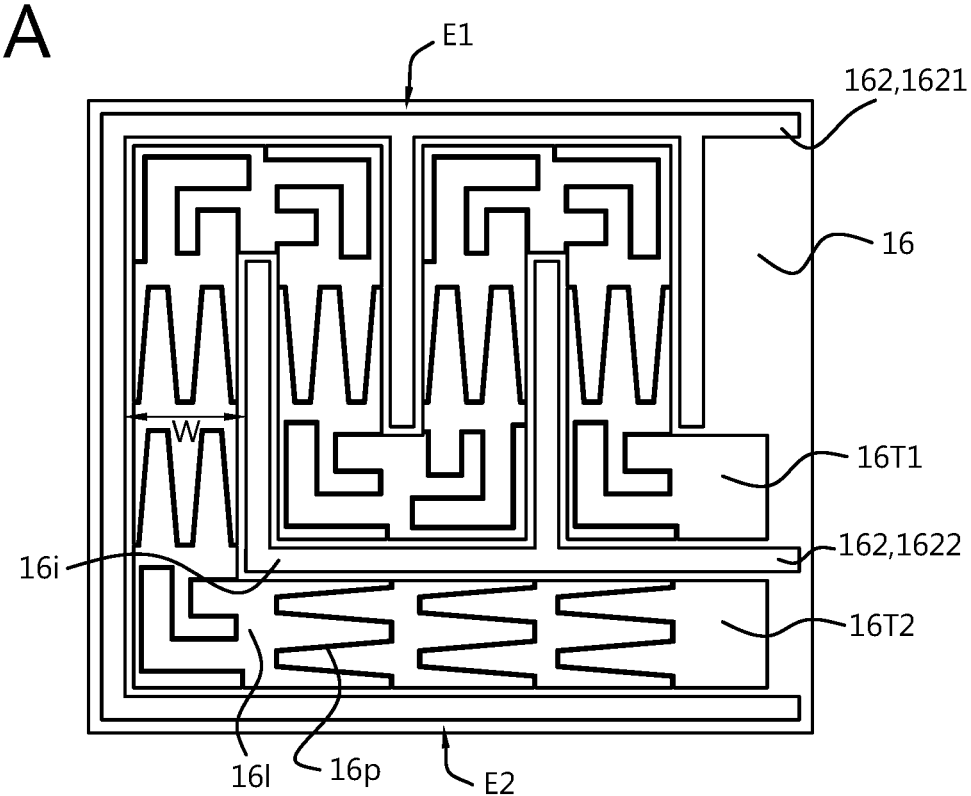
FIGS. 6A-6D show top views of a patterned backsheet 16, an arrangement of silicon based solar cells 36 on the backsheet 16, a first and second arrangement of a thin film submodule 12 on the backsheet 16 respectively, in accordance with an embodiment of the invention.

As shown in FIG. 6A, the patterned backsheet 16 typically comprises a patterned conductive layer arranged on an insulating carrier, for example, a patterned Cu layer on thermoplastic carrier. The patterned conductive layer comprises a first pattern layer 161 and a second pattern layer 162.

The first pattern layer 161 is arranged to provide a serial interconnection of the silicon substrate based solar cells (of the silicon based submodule 14, not shown). The first pattern layer 161 extends along a two-dimensional path between a terminal 16T1 of first polarity and a terminal 16T2 of second polarity, opposite to the first polarity.

The path has a width W that substantially corresponds with the width of a silicon substrate based solar cell and is shaped in accordance with the two-dimensional arrangement of the silicon substrate based solar cells and the condition for serial interconnection. The first pattern layer is arranged with sub-patterns 16P that provide connections between back contacts (not shown) of different polarity on adjacent silicon substrate solar cells, such that an electrical series connection is created between the silicon substrate based solar cells. The terminals 16T1 and 16T2 are arranged for connection to a DC-DC converter (not shown) for voltage conversion.

The second pattern layer 162 is positioned in the interspace 16i of the two-dimensional path of the first pattern layer and comprises a first group terminal connection line pattern 1621 and a second terminal connection line 1622 for connecting to a first group terminal V1 of first polarity of a thin film submodule 12 and a second group terminal V2 of second polarity of the thin film submodule 12, respectively.

As shown in FIG. 6A, the first group terminal connection line 1621 comprises one or fingers running between an edge E1 of the backsheet 16 and a centre thereof. In addition, the first group terminal connection line 1621 extends along edges of the backsheet.

The second group terminal connection line 1622 has a line pattern that is positioned in the interspace 16i on an opposite side of the path of the first pattern layer with respect to the first group terminal connection line 1621.

Figure 6B:
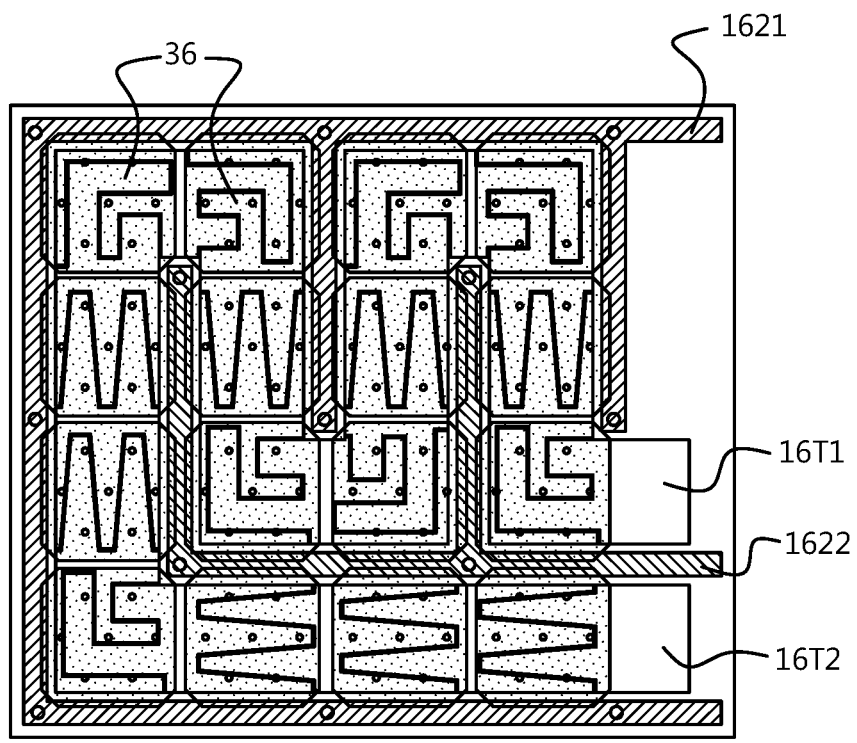

FIG. 6B shows a top view of a layout of silicon substrate based solar cells arranged on the backsheet shown in FIG. 6A.

The path of the first pattern layer 161 is covered by back-contact type solar cells 36. As explained with reference to FIG. 1, an encapsulant layer (not shown) is arranged between the backsheet 16 and the silicon based submodule 14 of silicon substrate based solar cells 36.

In this example, the silicon solar cells 36 are placed in a 4×4 arrangement. The silicon solar cells are positioned over the sub-patterns 16P (shown as dashed lines) in a manner that back-contacts of first polarity of one solar cell 36 are connected to back-contacts of the second polarity of an adjacent solar cell to achieve a serial connection between said solar cells. As is clearly seen, the first and second group terminal connection lines 1621, 1622 are positioned along the edge of the backsheet 16 and in the interspace 16i between the silicon solar cells, respectively.

Figure 6C:
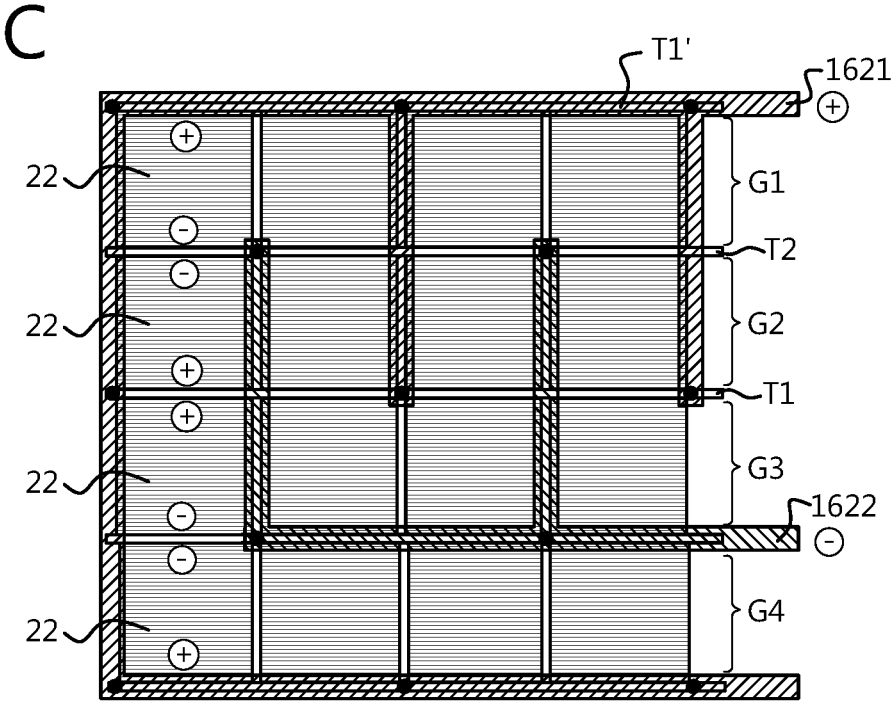
Figure 6D:
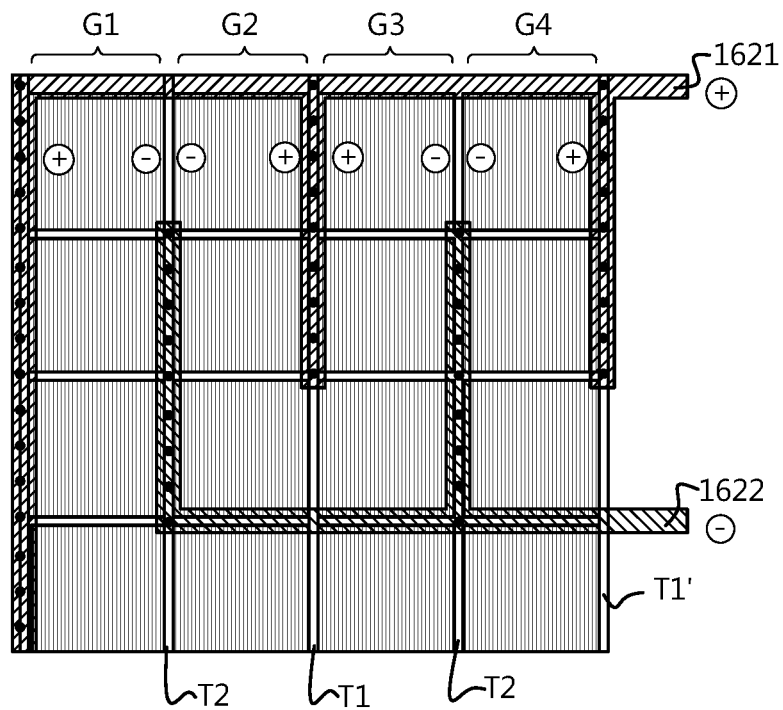

FIGS. 6C and 6D show a top view of a thin film submodule 12 according to an embodiment of the invention arranged on the backsheet 16 as shown in FIG. 6A.

The thin film submodule is arranged on top of the silicon based submodule 14 shown in FIG. 6B. As explained with reference to FIG. 1 an encapsulant layer (18, not shown) is arranged between the silicon based submodule 14 and the thin film submodule 12.

In the embodiment of FIG. 6C, the line-shaped first and second group terminals T1, T1', T2 of the groups of thin film solar cell strips 22 are oriented in a direction perpendicular to the direction in which the fingers of the first and second group terminal connection lines 1621, 1622 are extending. Thus, a contact between the line-shaped first group terminal T1 and the finger of the first group terminal connection line is made at the locations where there is a crossing or an overlap. Likewise, a contact between the line-shaped second group terminal T2 and the finger of the second group terminal connection line 1622 is made at an associated location of crossing or overlap. The additional first group terminals T1' at the edges of the thin film solar cell submodule 12 are arranged to contact the first group terminal connection line 1621 where there is overlap.

The orientation of the thin film solar cell strips 22 shown in FIG. 6C differs from the orientation shown in FIG. 6D by a rotation over 90°. The skilled in the art will appreciate that these orientations are considered as functionally equivalent.

In addition, it is noted that the thin film solar cell strips 22 are grouped in the thin film submodule in a same manner as the silicon solar cells 36 in the silicon based submodule 14, with an area size of each group G1 . . . G4 (or set 24, 26) substantially corresponding with the area size of a silicon substrate based solar cell 36, with the intermediate group terminal T1 or T2 positioned above an interspace 16i between adjacent silicon solar cells 36.

The skilled in the art will appreciate that other arrangements of silicon solar cells and groups of thin film solar cell strips are conceivable in accordance with the presented inventive concept. For example, a solar panel comprising a 10×8 or 10×16 silicon solar cell array with corresponding arrangement of groups of thin film solar cell strips can be created. As a further example, the bottom submodule can consist of thin film cells (e.g. in the form of strips).

In particular, combinations of specific features of various aspects of the invention may be made. An aspect of the invention may be further advantageously enhanced by adding a feature that was described in relation to another aspect of the invention.

In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

In the foregoing description of the figures, the invention has been described with reference to specific embodiments thereof. It will, however, be evident that various modifications and changes may be made thereto without departing from the scope of the invention as summarized in the attached claims. Also modifications may be made to the arrangement of thin film solar cells and/or silicon base solar cells without departing from the scope of the invention.

In addition, modifications may be made to adapt a material or substance of the thin film solar cells or silicon based solar cells to the teachings of the invention without departing from the essential scope thereof. The thin film material and/or the silicon material of the solar cells as described above may encompass variants or modifications in structure or composition.

Therefore, it is intended that the invention not be limited to the particular embodiments disclosed, but that the invention will include all embodiments falling within the scope of the appended claims.

The invention claimed is:

1. A solar panel comprising a silicon based submodule provided with an arrangement of a plurality of silicon based solar cells, a front transparent plate and a backsheet;
   the backsheet arranged with at least a first conductive pattern;
   the plurality of silicon based solar cells each being provided with electrical contacts on a rear surface with each rear surface arranged on the backsheet, such that each silicon based solar cell of the silicon based submodule is electrically connected to the first conductive pattern;
   the front transparent plate being arranged above the front surfaces of the plurality of silicon based solar cells,
   wherein a thin film photovoltaic submodule is arranged between the front transparent plate and the silicon based submodule, the thin film photovoltaic submodule comprises a plurality of thin film solar cells and is arranged with two thin film photovoltaic submodule contact terminals in a layout such that the thin film photovoltaic submodule contact terminals electrically connect to a second conductive pattern on the backsheet which second conductive pattern does not coincide with a location of the first conductive pattern on the backsheet, and
   the backsheet is arranged for four-terminal wiring layout with the first conductive pattern for providing electrical connections to the plurality of silicon based solar cells and the second conductive pattern for providing electrical connections to the plurality of thin film solar cells, and
   wherein the plurality of thin film solar cells is in series connection in an array, the plurality of thin film solar cells comprising a first group of thin film solar cells electrically connected in series in a first direction and an at least second group of thin film solar cells electrically connected in series in the first direction; the first group being in an electrical parallel connection with the second group, between the two thin film photovoltaic submodule contact terminals, one end of the electrical parallel connection being connected to one of the two thin film photovoltaic submodule contact terminals, the other end of the electrical parallel connection connected to the other of the two thin film photovoltaic submodule contact terminal, wherein a dimension of each group of thin film solar cells in the first direction corresponds with a dimension of at least one silicon based solar cell in the first direction, and the first group of serially interconnected thin film solar cells covers the at least one respective silicon based solar cell, the second group covers at least one other silicon based solar cell adjoining in the first direction, a group terminal of the first and second groups of thin film solar cells to the thin film photovoltaic submodule contact terminals is located outside the area of the at least one silicon based solar cell covered by the respective group, and is at a location in between the at least one silicon based solar cell and the at least one other adjoining silicon based solar cell.

2. The solar panel according to claim 1, wherein the first conductive pattern of the backsheet has a layout that provides a series connection of the plurality of silicon based solar cells, such that back-contacts of one polarity of one silicon based solar cell are connected to back-contacts of opposite polarity of an adjacent silicon based solar cell.

3. The solar panel according to claim 1, wherein the electrical connections of the two thin film photovoltaic submodule contact terminals to the second conductive pattern layout are at an outer edge of the backsheet surrounding the arrangement of the silicon based solar cells on the backsheet.

4. The solar panel according to claim 1, wherein the electrical connections of the two thin film photovoltaic submodule contact terminals to the second conductive pattern layout are at a location in between a pair of adjoining silicon based solar cells.

5. The solar panel according to claim 1, wherein the thin film solar cells are based on a perovskite material as photovoltaic material.

6. The solar panel according to claim 1, wherein the front transparent plate is attached to the silicon based submodule by a transparent encapsulant layer between the plurality of thin film solar cells and the plurality of silicon based solar cells.

7. The solar panel according to claim 1, further comprising a DC-DC converter which is operable for conversion of a first output voltage from the first conductive pattern and for conversion of a second output voltage from the second conductive pattern.

8. The solar panel according to claim 1, wherein the first conductive pattern is a two-dimensional path with a separating interspace, and the second conductive pattern is arranged within the separating interspace.

9. The solar panel according to claim 8, wherein the one of the two thin film photovoltaic submodule contact terminals is connected to a first part of the second conductive pattern arranged as terminal of a first polarity, and the other of the two thin film photovoltaic submodule contact terminals is connected to a second part of the second conductive pattern arranged as terminal of a second polarity, opposite the first polarity.

10. The solar panel according to claim 1, wherein each of the two thin film photovoltaic submodule contact terminals comprises a thin film contact pad that is arranged on the surface of the front transparent plate oriented towards the silicon based submodule;

the backsheet comprises a corresponding backsheet contact pad for each thin film contact pad, and the solar panel comprises an interconnecting conductive body between the thin film contact pad and the backsheet contact pad.

11. The solar panel according to claim 10, wherein each interconnecting conductive body is at a location that corresponds with a central area in between the corners of adjoining crystalline silicon solar cells in the silicon based submodule.

12. The solar panel according to claim 10, wherein the thin film contact pad is a patterned area of a thin film layer or a thin film layer structure on the front transparent plate.

13. The solar panel according to claim 10, wherein the interconnecting conductive body consists of an electrically conductive adhesive material.

14. The solar panel according to claim 13, wherein the interconnecting conductive body is dot-shaped or line-shaped or layer-shaped.

15. A method for manufacturing a solar panel comprising:
providing a silicon based submodule holding an arrangement of a plurality of silicon based solar cells;
providing a front transparent plate and a backsheet;
providing the backsheet with at least a first conductive pattern;
arranging the silicon based submodule between the front transparent plate and the backsheet with the front transparent plate being above the front surfaces of the plurality of silicon based solar cells, in which the plurality of silicon based solar cells each are provided with electrical contacts on a rear surface with each rear surface arranged on the backsheet, such that each silicon based solar cell of the silicon based submodule is electrically connected to the first conductive pattern;
arranging a thin film photovoltaic submodule on the surface of the front transparent plate facing towards the silicon based submodule, the thin film photovoltaic submodule comprising a plurality of thin film solar cells and being arranged with two thin film photovoltaic submodule contact terminals in a layout such that the two thin film photovoltaic submodule contact terminals electrically connect to a second conductive pattern on the backsheet outside of locations of the first conductive pattern on the backsheet, and
arranging the backsheet for four-terminal wiring layout with the first conductive pattern for providing electrical connections to the plurality of crystalline silicon based solar cells and the second conductive pattern for providing electrical connections to the plurality of thin film solar cells, and the method further comprises:
arranging the plurality of thin film solar cells in a series connection in an array, with a first group of thin film solar cells electrically connected in series in a first direction and a second group of thin film solar cells electrically connected in series in the first direction; the first group being in an electrical parallel connection with the second group, between the two thin film photovoltaic submodule contact terminals, with one end of the electrical parallel connection being connected to one of the two thin film photovoltaic submodule contact terminals and the other end of the electrical parallel connection connected to the other of the two thin film photovoltaic submodule contact terminals,
wherein a dimension of each group of thin film solar cells in the first direction corresponds with a dimension of at least one silicon based solar cell in the first direction, and the first group of serially interconnected thin film solar cells covers the at least one respective silicon based solar cell, the second group covers at least one other silicon based solar cell adjoining in the first direction, a group terminal of the first and second groups of thin film solar cells to the thin film photovoltaic submodule contact terminals is located outside the area of the at least one silicon based solar cell covered by the respective group, and is at a location in between the at least one silicon based solar cell and the at least one other adjoining silicon based solar cell.

* * * * *